(12) United States Patent
Barnes

(10) Patent No.: US 6,362,680 B1
(45) Date of Patent: Mar. 26, 2002

(54) OUTPUT CIRCUIT

(75) Inventor: William Bryan Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/690,605

(22) Filed: Oct. 17, 2000

(30) Foreign Application Priority Data

Oct. 28, 1999 (GB) .............................. 9925594

(51) Int. Cl.[7] .................. H03K 17/62; H03K 17/76; H03K 17/693; H03K 17/735
(52) U.S. Cl. .............. 327/407; 327/403; 327/199; 327/298; 327/225
(58) Field of Search ................ 327/403, 407, 327/241, 298, 299, 199–202, 212, 225; 365/189.02, 189.05; 713/400–401

(56) References Cited

U.S. PATENT DOCUMENTS

| 4,873,456 A | * | 10/1989 | Olisar et al. | 327/202 |
| 5,250,858 A | * | 10/1993 | Strong | 327/225 |
| 5,424,996 A | * | 6/1995 | Martin et al. | 365/233 |
| 5,774,080 A | * | 6/1998 | Morley | 341/101 |
| 5,818,366 A | * | 10/1998 | Morley | 341/101 |
| 5,968,180 A | * | 10/1999 | Baco | 713/400 |
| 6,137,331 A | * | 10/2000 | Llopis | 327/199 |

OTHER PUBLICATIONS

Patent Abstracts of Japan, vol. 014, No. 229 (E–0928), May 15, 1990 & JP 02 058921 Feb. 28, 1990.
Kaji Matsumoto et al, Designs of 622 MHZ Low–Power CML Embeded Macros on Low–Cost 0.44MUM BICMOS Gate Array, NEC research and Development, JP, Nippon electric Ltd. Tokyo, vol. 37, No. 2, Apr. 1, 1996, pp. 235–240, XP000621992.
Negus, K.J., Multi–Gbits/s Silicon Bipolar Multiplexer and Demultiplexer with Interleaved Architectures, proceedings of the Bipolar Circuits and Technology Meeting, US New York, IEEE, vol.–, 1991 pp. 35–38, XP000245946.

* cited by examiner

*Primary Examiner*—Terry D. Cunningham
*Assistant Examiner*—Long Nguyen
(74) *Attorney, Agent, or Firm*—Wolf, Greenfield & Sacks, P.C.; James H. Morris; Robert A. Skrivanek, Jr.

(57) ABSTRACT

An output circuit which can minimize the delay in combining two clocks comprises a multiplexer with a flip flop connected to one input and a clocked latch connected to the other. The clocked latch is transparent during one clocking state so that changes to its input appear directly at its output.

5 Claims, 1 Drawing Sheet

OUTPUT CIRCUIT

FIELD OF THE INVENTION

The present invention relates to an output circuit.

BACKGROUND OF THE PRESENT INVENTION

In circuits where it is desired to combine together two clocked outputs from respective clocked logic circuits into a single clocked output, production of the final output may need to be delayed to allow the outputs of the clocked logic circuits to settle. This can be disadvantageous in that the time available for a downstream circuit to respond is restricted by such a delay. It may be possible to overcome this difficulty by ensuring that downstream circuitry is fast responding but this in itself has a cost disadvantage since fast circuits are normally more expensive. This is especially true where the downstream circuitry is a semiconductor memory.

It is accordingly an object of the present invention to at least partially mitigate the difficulties of the prior art.

SUMMARY OF THE INVENTION

According to a first aspect of the present invention there is provided an output circuit comprising a two input multiplexer having a clock terminal, a flip-flop coupled to one of the multiplexer inputs and a clocked latch coupled to the other of the multiplexer inputs, wherein said flip-flop and said clocked latch each have a clock input and said clock terminal of said multiplexer and said clock inputs of said flip-flop and said clocked latch are connected to a common clock line, said clocked latch being transparent when one logic state is applied to said clock line and wherein the multiplexer connects the output of said clocked latch to the multiplexer output at a transition to the other logic state on said clock line.

Preferably the flip-flop responds to a transition on said clock line from said other state to said one state.

According to a second aspect of the present invention there is provided an integrated circuit comprising an output circuit of the first aspect and further comprising a two-state clock generator connected to said clock line.

According to a third aspect of the present invention there is provided a method of providing an output signal comprising:

providing an input to a first multiplexer input via a clocked latch;

providing an input to a second input of said multiplexer via a flip-flop;

providing a clock signal to clock inputs of said multiplexer, said flip-flop and said clocked latch such that said clocked latch is transparent during one clock state and the multiplexer provides an output from the output of said flip-flop during said one state and the output of the clocked latch as the multiplexer output upon the transition to the other clock state.

BRIEF DESCRIPTION OF THE DRAWINGS

An embodiment of the present invention will now be described, by way of example only, with reference to the accompanying drawings in which.

DESCRIPTION OF THE PREFERRED EMBODIMENT

Figure 1:
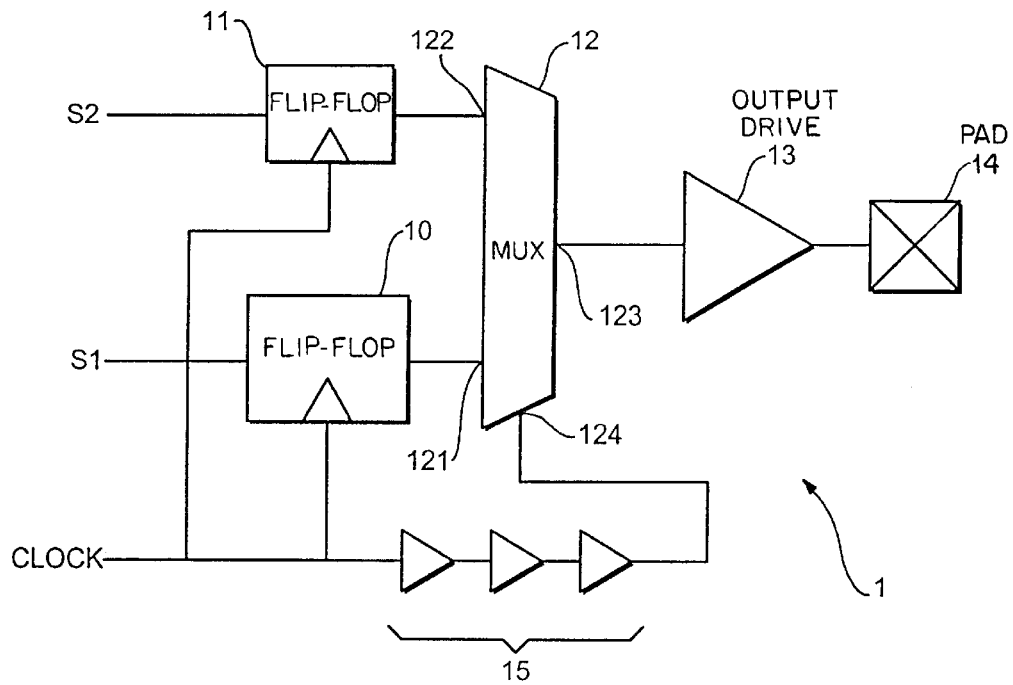
FIG. 1 shows a known output circuit.

In the various figures like reference numerals refer to like parts.

Referring first to FIG. 1, a first signal S1 is connected to the input of a first flip-flop 10 and a second input signal S2 is connected to the input of a second flip-flop 11. The output of the first flip-flop 10 is connected to the first input 121 of the multiplexer 12 and the output of the second flip-flop 11 is connected to the second input 122 of the multiplexer 12. Each of the flip-flops 10 and 11 receives a clock signal at a clock input. The multiplexer 12 connects its first input 121 to its output 123 during a first clock state and its second input 122 to its output 123 during a second opposite clock state. The multiplexer output 123 is connected via an output drive 13 to a pad 14 to which external circuitry, such as a DRAM, is connected.

Continuing to refer to FIG. 1, it will be seen that figurative delay producing elements 15 are shown connecting the clock input line to the clock input 124 of the multiplexer. The delay 15 is required because of the time needed for the flip-flops 10 and 11 to respond and settle. If for example the first input 121 is currently at logic 0 with the clock input 124 being such as to supply the second input 122 as the multiplexer output 123, and if the first input S1 is at logic 1, then application of the clock edge to the clock input of the first flip-flop 10 will cause the first input to be pulled up to logic 1 with a delay in response caused mainly by the gate delays in the flip-flop 10. If the clock pulse applied to clock input 124 of the multiplexer 12 were applied at the same time as the application to the flip-flop 10, the multiplexer output would not respond correctly.

As previously discussed, the difficulties incurred by the delay 15 are that the output at pad 14 is later than it need be, and that delay 15 will need to be precisely correct to avoid an output glitch.

Figure 2:
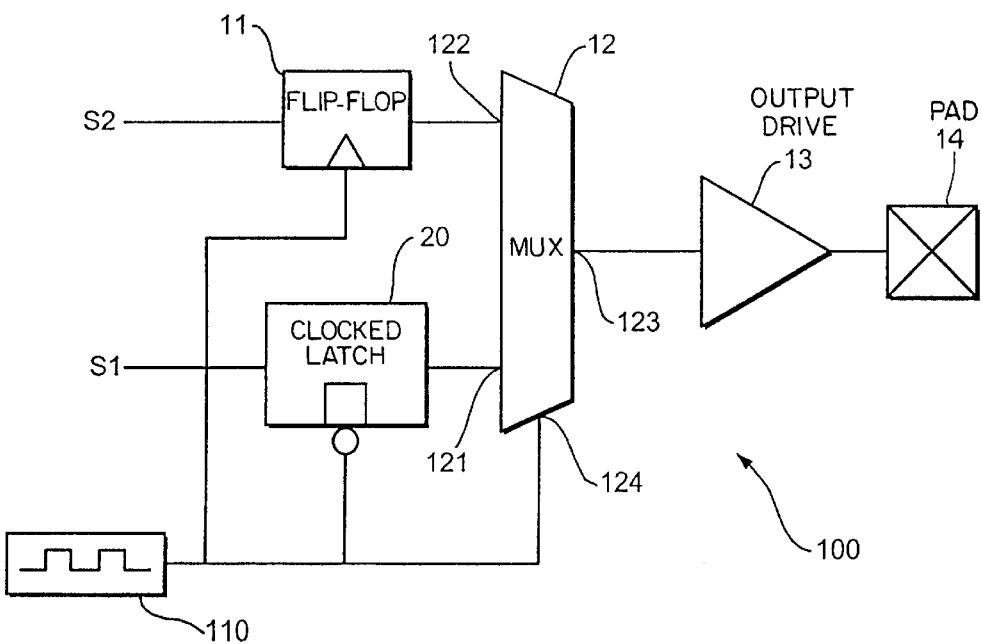
FIG. 2 shows an embodiment of the present invention.

Referring now to FIG. 2, an integrated circuit embodying the invention comprises a clock circuit 100 and a two state clock generator 110. It will be seen that by comparison with FIG. 1, the first flip flop 10 is replaced by a clocked latch 20 and that no extra delay exists between the clock generator 110 and the clock input 124 of the multiplexer 12.

The clocked latch 20 is transparent to the input signal S1 while the clock is in a first state, here logic 0. For clarity, "transparent" indicates that changes at the output follow changes at the input. When the clock is in a second opposite state, the clocked latch is no longer transparent and its object is latched at the state pertaining immediately before the transition to that second state. Thus, while the clock is at logic 0, the second clock input 122 of the multiplexer is connected to the multiplexer output 123 and the first input 121 of the multiplexer 12 follows the logic state of the signal S1.

When the clock signal changes state, the output of the clocked latch 20 becomes fixed at the state pertaining at its input immediately before the clock transition. Further changes which occur thereafter to the signal S1 are not passed through by the latch and do not appear at the first input 121 of the multiplexer 12. The clock transition causes, the multiplexer to switch over so that the first input 121 is provided as the multiplexer output 123. The result is that the multiplexer output 123 changes state substantially at the same time as the clock signal makes its transition. When the clock makes its second transition from logic 1 to logic 0, the second flip-flop 11 is already in the fixed state due to the earlier first transition and thus there is no need to delay the application of the clock pulse to the clock input terminal 124 of the multiplexer 12.

It will be clear to those skilled in the art that with the circuit shown in FIG. 2, the multiplexer 12 switches when its inputs are in a fixed settled state and substantially contemporaneously with the clock input terminal changing state.

What is claimed is:

1. An output circuit comprising a two input multiplexer having a clock terminal, a flip-flop coupled to one of the multiplexer inputs and a clocked latch coupled to the other of the multiplexer inputs, wherein said flip-flop and said clocked latch each has a clock input, and said clock terminal of said multiplexer and said clock inputs of said flip-flop and said clocked latch are connected to a common clock line, said clocked latch being transparent when one logic state is applied to said clock line and wherein said multiplexer connects an output of said clocked latch to an output of said multiplexer at a transition to the other logic state on said clock line.

2. An output circuit as claimed in claim 1 wherein said flip-flop responds to a transition on said clock line from said other state to said one state.

3. An integrated circuit comprising a two input multiplexer having a clock terminal, a flip-flop coupled to one of the multiplexer inputs and a clocked latch coupled to the other of the multiplexer inputs, wherein said flip-flop and said clocked latch each has a clock input, and said clock terminal of said multiplexer and said clock inputs of said flip-flop and said clocked latch are connected to a common clock line, said clocked latch being transparent when one logic state is applied to said clock line and wherein said multiplexer connects an output of said clocked latch to an output of said multiplexer at a transition to the other logic state on said clock line, and further comprising a two state clock generator connected to said clock line.

4. An integrated circuit as claimed in claim 3 wherein said flip-flop responds to a transition on said clock line from said other state to said one state.

5. A method of providing an output signal, comprising:

providing an input to a first input of a multiplexer via a clocked latch;

providing an input to a second input of said multiplexer via a flip-flop; and providing a clock signal to a clock input of said multiplexer, a clock input of said flip-flop, and a clock input of said clocked latch so that said clocked latch is transparent during one clock state of the clock signal and said multiplexer connects an output of said flip-flop as an output of said multiplexer during said one clock state and so that said multiplexer connects an output of said clocked latch as the output of said multiplexer from a transition to the other clock state.

* * * * *